(12) United States Patent
Bachman

(10) Patent No.: US 11,362,620 B1
(45) Date of Patent: *Jun. 14, 2022

(54) LARGE SCALE PRODUCTION OF PHOTOVOLTAIC CELLS AND RESULTING POWER

(71) Applicant: Eric C. Bachman, Oberlin, OH (US)

(72) Inventor: Eric C. Bachman, Oberlin, OH (US)

(*) Notice: Subject to any disclaimer, the term of this patent is extended or adjusted under 35 U.S.C. 154(b) by 0 days.

This patent is subject to a terminal disclaimer.

(21) Appl. No.: 15/930,423

(22) Filed: May 12, 2020

Related U.S. Application Data

(63) Continuation-in-part of application No. 15/687,875, filed on Aug. 28, 2017, now Pat. No. 10,651,329, which is a continuation-in-part of application No. 14/215,747, filed on Mar. 17, 2014, now Pat. No. 9,748,431.

(60) Provisional application No. 61/794,688, filed on Mar. 15, 2013.

(51) Int. Cl.
*H02S 40/36* (2014.01)
*H02S 20/30* (2014.01)
*H02S 50/00* (2014.01)
*B33Y 30/00* (2015.01)
*B33Y 80/00* (2015.01)

(52) U.S. Cl.
CPC .............. *H02S 40/36* (2014.12); *H02S 20/30* (2014.12); *H02S 50/00* (2013.01); *B33Y 30/00* (2014.12); *B33Y 80/00* (2014.12)

(58) Field of Classification Search
CPC ........ H01L 31/05; H01L 31/046; H01L 31/18
See application file for complete search history.

(56) References Cited

U.S. PATENT DOCUMENTS 9,748,431 B1 * 8/2017 Bachman ................ H01L 31/18
10,651,329 B1 * 5/2020 Bachman .............. H01L 31/046

* cited by examiner

*Primary Examiner* — Herve-Louis Y Assouman
(74) *Attorney, Agent, or Firm* — Calfee, Halter & Griswold LLP

(57) ABSTRACT

The present application discloses systems and methods for manufacturing large PV sheets and conveying large PV sheets away from the PV manufacturing site while routing power from the PV sheet to the grid.

20 Claims, 20 Drawing Sheets

| Time of Day | Power Output (% of Max Output) |
|---|---|
| 6am | 10 |
| 7am | 20 |
| 8am | 40 |
| 9am | 60 |
| 10am | 80 |
| 11am | 90 |
| Astro. Noon | 100 |
| 1pm | 90 |
| 2pm | 80 |
| 3pm | 60 |
| 4pm | 40 |
| 5pm | 20 |
| 6pm | 10 |

| Time of Day | Power Output (% of Max Output) | | |
|---|---|---|---|
| | East-Side | West-Side | Combined |
| 6am | 10 | 5 | 15 |
| 7am | 40 | 10 | 50 |
| 8am | 70 | 20 | 90 |
| 9am | 90 | 25 | 115 |
| 10am | 100 | 30 | 130 |
| 11am | 90 | 40 | 130 |
| Astro. Noon | 50 | 50 | 100 |
| 1pm | 40 | 90 | 130 |
| 2pm | 30 | 100 | 130 |
| 3pm | 25 | 90 | 115 |
| 4pm | 20 | 70 | 90 |
| 5pm | 10 | 40 | 50 |
| 6pm | 5 | 10 | 15 |

LARGE SCALE PRODUCTION OF PHOTOVOLTAIC CELLS AND RESULTING POWER

CROSS REFERENCE TO RELATED APPLICATIONS

This application is a continuation-in-part of U.S. patent application Ser. No. 15/687,875, filed on Aug. 28, 2017 and entitled Large-Scale Production of Photovoltaic Cells and Resulting Power, now U.S. Pat. No. 10,651,329, which is a continuation-in-part of U.S. patent application Ser. No. 14/215,747, filed on Mar. 17, 2014, and entitled Large-Scale Production of Photovoltaic Cells and Resulting Power, now U.S. Pat. No. 9,748,431, which claims priority to, and any other benefit of, U.S. Provisional Patent Application Ser. No. 61/794,688, filed on Mar. 15, 2013, and entitled Large-Scale Production of Photovoltaic Cells and Resulting Power ("the '688 Application"), which applications are hereby incorporated by reference in their entireties.

TECHNICAL FIELD

This invention relates to the production of photovoltaic cells and their production on a large scale utilizing 3D printing techniques where layers of chemical compounds, lengths of conductive materials or other such manufacturing techniques are applied to a continuous ribbon of durable substrate material to produce a many miles long continuous array of solar cells that potentiate a photovoltaic reaction when exposed to sunlight AND the subsequent "In-Situ" generation of large-scale electrical power for distribution to the regional electrical grid system for utilization by residential, commercial or other end-users.

BACKGROUND

The conventional manufacturing of photovoltaic solar cells for the production of electricity results in a thick, heavy combination of silicon, glass, metal and plastic that are called solar panels or solar cells. These solar panels often need some type of metal or concrete stand or framework to hold them at an optimum angle to the Sun's light radiation. Needing to be produced in polluting large factories with "clean-rooms", vast labor forces, extensive tooling and equipment, conventional solar panels cannot be produced on a large-scale in an economic or efficient manner. Moreover, the transportation, installation and deployment of such conventional solar panels at the location of the final end-user is expensive and time consuming yet yields comparatively little in added solar power capacity that might actually have a significant impact upon our reliance on fossil fuels to generate the bulk of our electrical energy needs. In fact, to replace all the electricity generated by fossil fuels in the United States alone (approximately 2,644 TWH), over 500 sq. miles of the most efficient solar panels in production today would be required. This equates to more than 1.3 Billion separate, individual, one-meter square conventional solar panels. Each panel requiring costly, environmentally degrading and time-consuming manufacturing, transportation and installation processes. Obviously, to even approach the surface area of photovoltaic cells that would actually bring us an appreciable benefit, significant improvements are needed on all fronts—manufacturing, transportation and deployment. The embodiments described herein bring all these needed improvements to bear in one environmentally sound, cost effective, high-capacity, high-speed, scalable, modular, upgradable and efficient design.

Photographs of the large factories, labor forces and complicated, expensive manufacturing processes that are required in conventional solar cell production standards are shown herein as FIG. 9.

Photographs of comparatively small-scale and expensive deployments of conventional solar panel technology standards in "fields" or "farms" with concrete stands and steel framework are shown herein as FIG. 10 on page 1 of the document "Concept for a Modular Photovoltaic Printer", which is attached as Appendix 1 to the '688 Application, which is incorporated herein by reference in its entirety.

SUMMARY

Recently, Thin-Film PhotoVoltaic Solar Cell Technology ("TFSC") has been developed. This Thin-Film technology results in a thin photovoltaic cell that can be and can effectively be printed on a thin, flexible substrate like plastic, laminate, composite, fabric or other such material in multiple layers as narrow as 1-10 microns thick. The embodiments of this invention provide for the delivery of these Thin-Film Printed PhotoVoltaic Solar Cells on a Large-Scale with In-Situ High-Output Electrical Power Generation.

The structural embodiment of Large-Scale Production of Photovoltaic Cells and Resulting Power ("LSPPVRP") which utilizes TFSC technology is an exemplary Integrated Large-Scale TFSC Production and Power Generating Station ("PVPPGS") structure that has an approximate width of 150 feet, depth of 60 feet and height of 30 feet in this exemplary embodiment.

PRIOR ART

This section presents exemplary types of solar cells that can be used in the inventive systems, methods, and solar cells discussed herein.

One exemplary type of Thin-Film Solar Cell as described in Appendix 2 to the '688 Application, which is incorporated herein by reference in its entirety, has six layers on a durable substrate material. The six layers are a back contact comprised of a conductive polymer, a P-type Semiconductor Material, an N-type semiconductor material, a front contact which is again a conductive polymer, a protective coating and an anti-reflective coating. In exemplary embodiments of the present invention, six print heads would be used, one for each material applied in succession on the substrate.

Other exemplary printable Thin-Film Solar Cells are described in the Appendices to the '688 Application, which is incorporated herein by reference in its entirety. An additional exemplary printable Thin-Film Solar Cell is described in the following, which is incorporated herein by reference in its entirety:

Plexcore® PV Inks for Printed Solar Power
http://www.sigmaaldrich.com/technical-documents/articles/technology-spotlights/plexcore-pv-ink-system.html.

Exemplary Thin-Film Solar Cell printers for printing PV sheets and PV ribbons used herein are described in the following, which are incorporated herein by reference in their entireties:

http://oilprice.com/Latest-Energy-News/World-News/New-Machine-can-Print-PV-Solar-Cells-at-a-Rate-of-10-Metres-a-Minute html;
http://www.kcet.org/news/rewire/solar/photovoltaic-pv/need-more-solar-cells-well-run-off-a-few-hundred-for-ya-mate.html.

DESCRIPTION

This Detailed Description merely describes exemplary embodiments of the invention and is not intended to limit the scope of the claims in any way. Indeed, the invention as claimed is broader than and unlimited by the preferred embodiments, and the terms used in the claims have their full ordinary meaning, unless an express definition is provided herein.

Exemplary embodiments of the invention herein result in a "ribbon" of continuous arrayed photovoltaic cells that extends many miles downrange on a track system (either substantially horizontally or vertically) that emanate from a large-scale, thin-film solar cell 3D printing structure, system and method with In-Situ high-output electrical power generation for supply to the main power grid.

Figure 1:
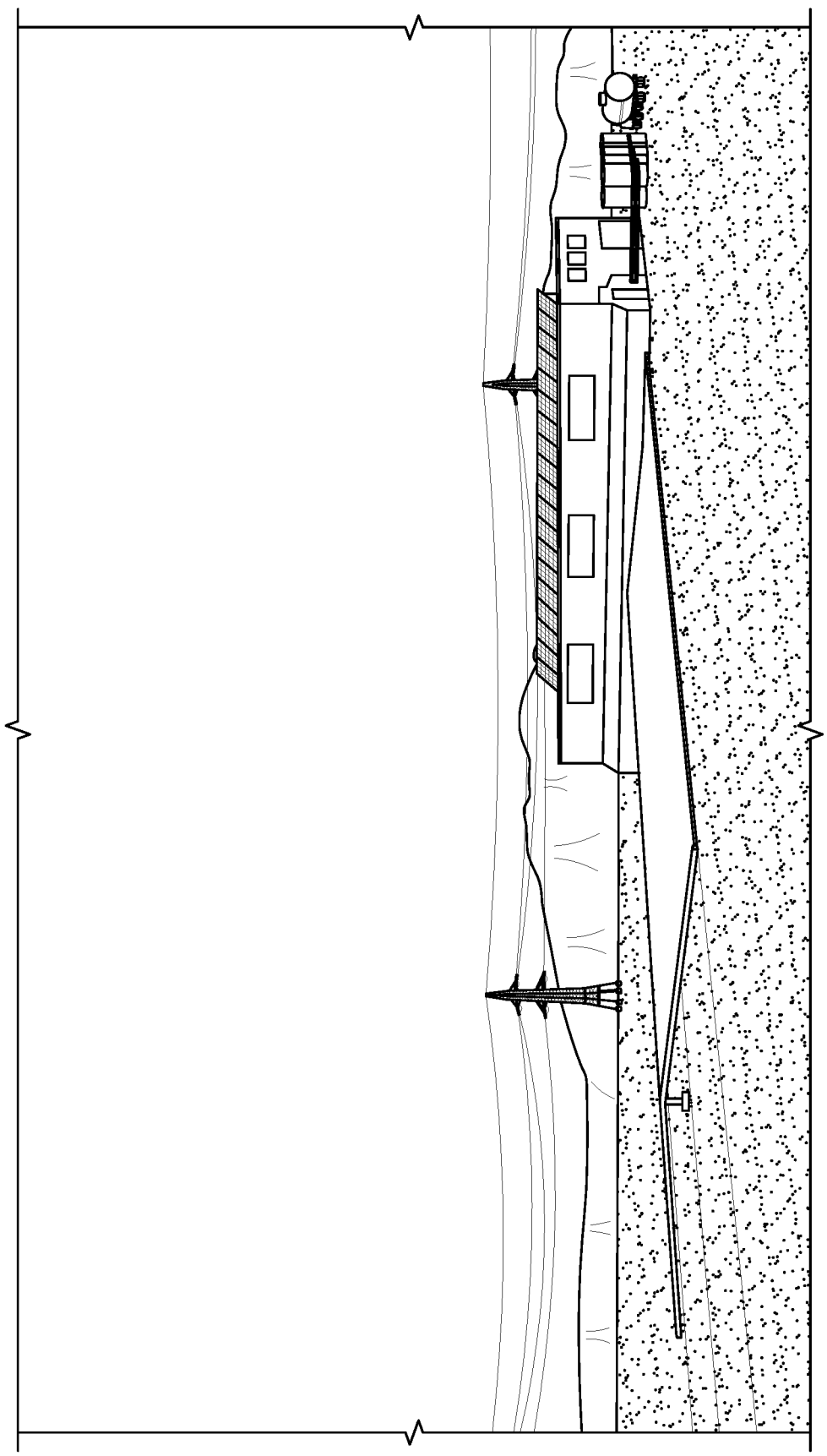
FIG. 1 is a Front/Right illustrated view of an exemplary Integrated Large-Scale Photovoltaic Printing and Power Generating Station ("PVPPGS") structure that has an approximate width of 150 feet, depth of 60 feet and height of 30 feet.

In FIG. 1, we see the front view of an exemplary Integrated Large-Scale Photovoltaic Printing and Power Generating Station ("PVPPGS") structure that has an approximate width of 150 feet, depth of 60 feet and height of 30 feet. The primary purpose of this PVPPGS structure is to house and contain the mechanisms, components and equipment as required by the particular process or method so utilized at that time for the Large-Scale Production of Photovoltaic Cells and Resulting Power. In this exemplary embodiment, there are two separate Left and Right PV Outputs that are each 54 feet in width onto which the layers of chemical compounds, lengths of conductive materials or other such manufacturing techniques have been applied to a continuous ribbon of durable substrate material as required by the particular process or method so utilized at that time in order for the completed production output to potentiate a photovoltaic reaction when such is exposed to sunlight ("PV Output"). The PV Outputs (Left/Right) are produced within the PVPPGS structure by two distinct systems of multiple print heads, nozzles, sprayers, LEDs, lasers, applicators, fasteners, punches, cutters, presses and/or other such tooling and equipment ("Three-Dimensional Printing System" or "3DPS") as required by the particular process or method so utilized at that time.

In FIGS. 5A-5K, we can see that each of these individual component devices may be stationary or mobile along a track that covers the entire width of each sheet of substrate. The particular process, method or manufacturing techniques to be used in production may be improved from time to time. As a result, the specific chemicals, compounds, or materials that is needed by the 3DPS can be changed, added or removed as necessary. In addition, the specific print heads, nozzles, sprayers, LEDs, lasers, applicators, fasteners, punches, cutters, presses and/or other such tooling and equipment that is needed by the 3DPS can be changed, added or removed as necessary. For instance, the use of ten (10) separate print heads, two "X" component modules, two (2) laser modules and three (2) conductive wire applicators is only exemplary in this illustration and there may be more or less than this number as required by the particular process or method so utilized at that time.

Within the PVPPGS structure, this substrate is routed in a "newsprint" fashion through a corresponding system of pullers, rollers and tensioners in order to maximize the separate surface areas or distinct plains available for simultaneous application of multiple chemical compounds, conductive materials or other such manufacturing techniques. In this exemplary embodiment, the interior of the PVPPGS structure also contains small control, office, maintenance, storage and break spaces for a dedicated crew of 1-2 workers to successfully maintain proper PV cell production and control proper operational electrical current output to the power grid. Additionally, there are many walkways, stairs, ramps and access points to the along with ample window, access and garage doors to allow for a bright, safe and efficient work environment.

In FIG. 1, in front of and exiting the exemplary PVPPGS structure in this front-view illustration, we see the two completed PV Outputs (Left/Right) that are each 54 feet in width that come together in a low-angled "Tent Configuration" that is approximately 100-feet wide. In some exemplary embodiments, each side having been recently produced within the PVPPGS structure by the Three-Dimensional Printing System upon two separate continuous ribbons of durable substrate material. Although in this Illustration we see the PV Output extending downrange only a very short distance, the actual PV Output would continue downrange many miles depending upon the total time the 3DPS systems has been operational. Utilizing 2013 Thin-Film Solar Cells technology, it is projected that each (Left/Right) 54-foot wide 3DPS system can produce a continuous ribbon array of solar cells approximately three (3) miles long per year and print 24 hours per day, 365 days per year. At this rate in fifteen years, a forty-five (45) mile length of Thin-Film Solar Cells would be produced. It is estimated that the printer would be a net user of electricity from the power grid until the solar cell PV Output is long enough such that it would become a net producer of electricity. It is estimated that this embodiment would become a net producer as opposed to a consumer of electricity in about 6 months.

In FIG. 1, in front of and exiting the PVPPGS structure in this front-view illustration, we also note the two Left and Right PV Outputs are routed upward on each inside edge in a low-angled "tent" configuration of 10-15 degrees ("Tent Configuration") in order to 1) maximize whole-day sunlight exposure, 2) allow for drainage of rainwater away from the PV Output, 3) allow for natural cleaning of dust, dirt and droppings from the PV Output by rainwater and 4) allow the high-voltage cables to be elevated up and away from the ground along the "peak" of the two angled sections.

In FIG. 1, in front of the PVPPGS structure in this front-view illustration, we also note the two Left and Right PV Outputs are supported by a Downrange Trestle Support ("DTS") structure that extends away from the PVPPGS structure and downrange for the entirety of the path and length of the PV Output. The DTS structure would consist of prefabricated triangular steel trestles affixed to ground buried concrete pilings approximately every 50-100 feet of longitudinal length and connected to each other by tubular steel girders. The PV Output would be pulled away from the PVPPGS structure by a system of gears, cogs, cables, pulleys and/or friction reduction devices attached to the DTS structure in various locations that is synchronized exactly with the then-current longitudinal PV Output production speed. These DTS components would be added in a modular fashion on a regularly scheduled basis in order to balance future production needs with current operational or fiscal limitations. In exemplary embodiments, the DTS structure extend either directly South or directly North (or substantially South or Substantially North) away from the printer/building, e.g., on an optimal route South (or North), taking into account geography, property rights, environmental concerns, etc. This track would eventually extend miles (or many miles) out from the printer building. In exemplary embodiments, the track system (either "shower curtain" or "lay flat") is installed manually, as needed. For example, segments of track system can be added to the distal end as the distal end of the printed PV sheet extends to that distal end of the track; one simply must be ahead of the printer so the printer can print continuously.

In FIG. 1, behind the PVPPGS structure in this front-view illustration, we note the high-voltage transmission lines and towers that connect directly to the main power grid. In some exemplary embodiments, each of the separate PVPPGS structures are thereby connected to the main power grid by high-voltage cables that run the length of the PV output along the "peak" of the two angled PV Output sections. These Primary Power+/−("PP+/−") cables collect/return the entirety of the electrical energy being produced by the photovoltaic cells along the length of the output. At the terminating point where the PV output first exits the PVPPGS structure, the PPC cables are routed laterally to two separate spools of reserve cable (positive and negative) and then routed up and rearwards until terminating and connecting to the high-voltage transmission lines which are supported by the towers that are visible in this illustration.

Figure 2:
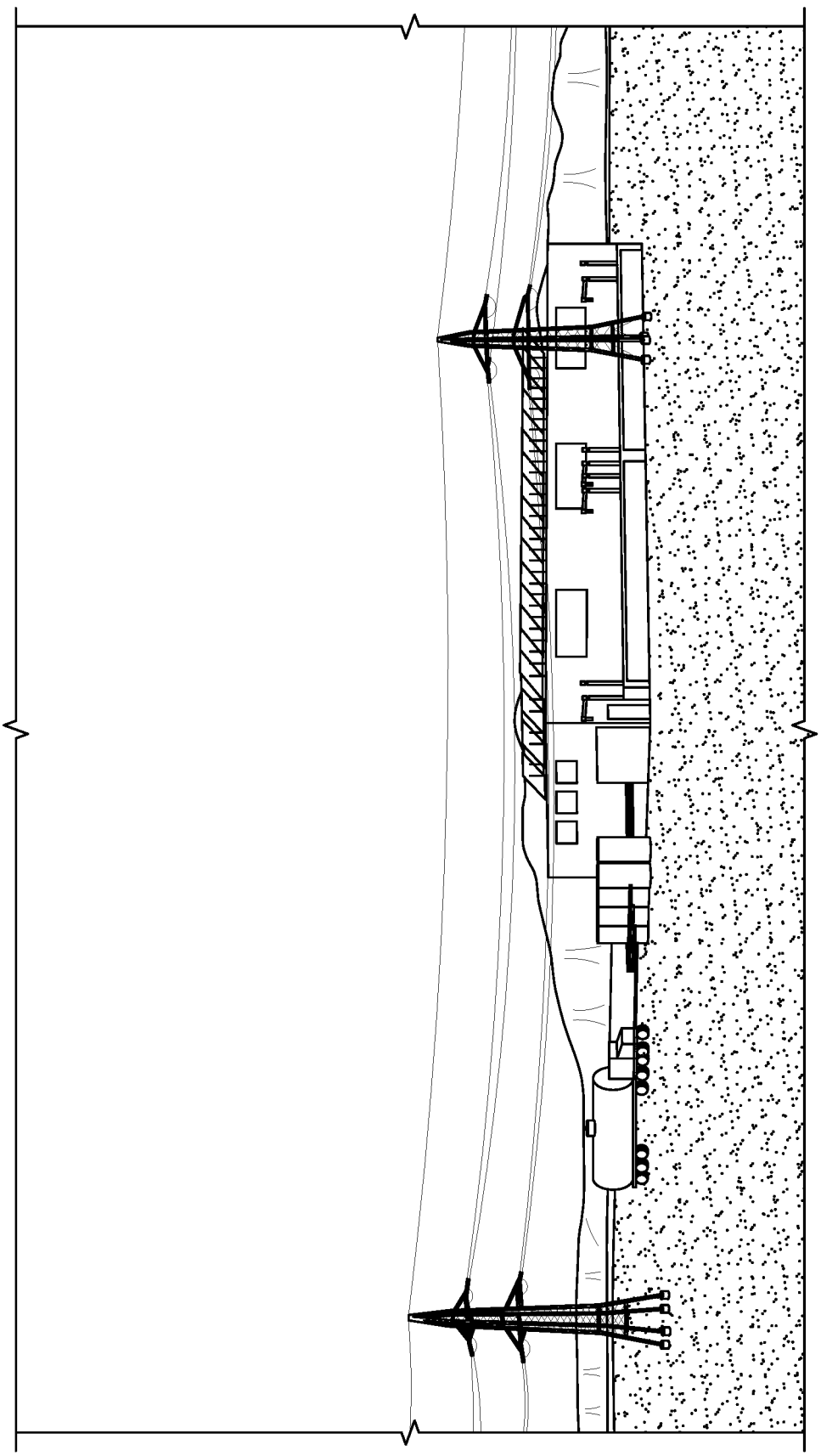
FIG. 2 is a Rear/Right illustrated view of an exemplary Integrated Large-Scale Photovoltaic Printing and Power Generating Station ("PVPPGS") structure that has an approximate width of 150 feet, depth of 60 feet and height of 30 feet.

In FIG. 2, we see the rear view of an exemplary Integrated Large-Scale TFSC Production and Power Generating Station ("PVPPGS") structure that has an approximate width of 150 feet, depth of 60 feet and height of 30 feet.

In FIG. 2, behind the PVPPGS structure in this rear-view illustration, we note two (2) separate compartmented sections of the structure. These compartments have an approximate width of 54 feet each, depth of 10 feet and height of 10 feet with a hinged and angled roof section that can be raised and lowed ("Substrate Roll Compartments" or "SRC"). These Substrate Roll Compartments hold two (2) separate spools of durable substrate material (left/right). This substrate material would most likely be a woven carbon fiber fabric or other such similar durable, high-strength material that is wound upon a 54-foot-wide spool. In some exemplary embodiments, each spool would contain a length of substrate that would most likely be between 4,000 ft.-6,000 ft. Upon depletion of the two spools of substrate material, two new spools of substrate material would be transported in by rail and/or truck. The depleted spools would be removed from the Substrate Roll Compartment and two new replacement spools would be installed and permanently joined to the tail-end of previously depleted substrate sheet across the entire width.

In FIG. 2, behind the PVPPGS structure in this rear-view illustration, we also note four (4) high-tonnage jib cranes positioned above the two (2) separate compartmented sections of the structure containing the spools of substrate material. These jib cranes are used to facilitate the removal of the depleted spools of substrate material and then to install the new replacement spools of substrate material which have been transported immediately adjacent to the Substrate Roll Compartment by Rail or Truck.

In FIG. 2, to the left of the PVPPGS structure in this rear-view illustration we also note eight (8) liquid storage tanks that are connected and routed into the PVPPGS structure through sections of valves and piping. These liquid storage tanks are used to store a long-term reserve of each of the chemical compounds as required by the particular process or method so utilized at that time to be applied to the substrate material. Once pumped inside the PVPPGS structure from the storage tanks the liquids would be routed to the specific 3DPS component that handles and applies to the substrate material that particular liquid through a network of pipes, valves, hoses, tanks, reservoirs and/or other such components. The necessary chemical compounds or ratios thereof required by a particular process or method may be changed, eliminated or added through subsequent improvements of such. As a result, these storage tanks may be used to store differing compounds or quantities as process or method improvements are developed. Additionally, the use of eight (8) separate tanks is only exemplary in this illustration and there may be more or less than this number as required by the particular process or method so utilized at that time.

In FIG. 2, also to the left of the PVPPGS structure in this rear-view illustration we note a tanker truck that is exemplary of the type that might be brought in on a set schedule in order to replenish the reserve of each of the chemical compounds as required by the particular process or method so utilized at that time.

Figure 3:
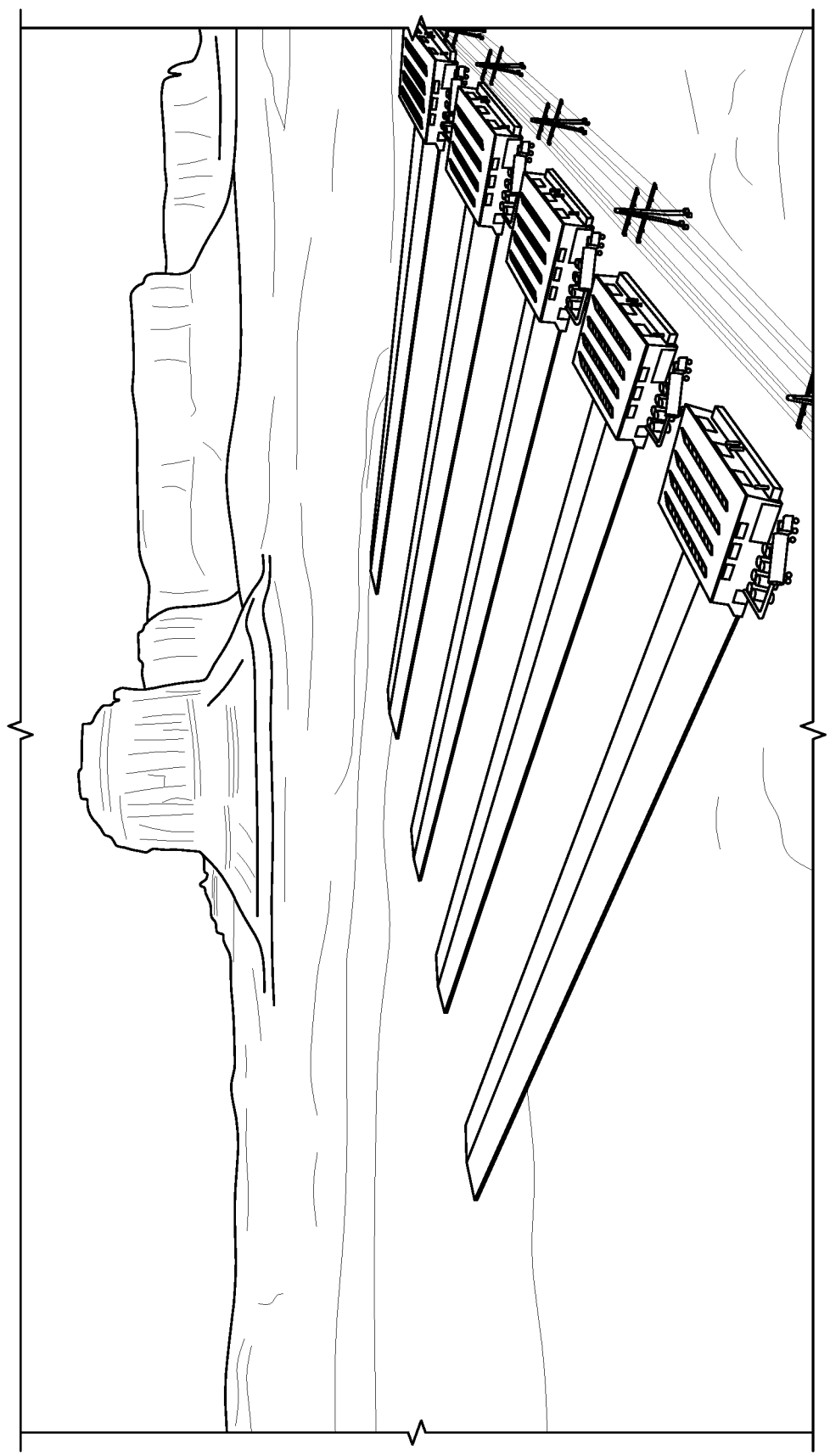
FIG. 3 is a Top/Rear/Right illustrated view of a plurality of exemplary Integrated Large-Scale Photovoltaic Printing and Power Generating Station ("PVPPGS") structures positioned proximate one another that each have an approximate width of 150 feet, depth of 60 feet and height of 30 feet.

In FIG. 3, we see the top view of an exemplary Integrated Large-Scale TFSC Production and Power Generating Station ("PVPPGS") structure that has an approximate width of 150 feet, depth of 60 feet and height of 30 feet.

In FIG. 3, we note in this top-view illustration that these PVPPGS structures would be best located in geographical environments that have many clear, cloudless days with bright sunshine over long hours of the day such as would be common in a low to mid latitude desert regions or, especially, "high desert" regions (desert regions at higher elevations). However, these PVPPGS structures could be built in any location that enjoys sunshine—albeit with reduced efficiency and prolonged returns on investment.

In FIG. 3, we also note in this top-view illustration that these PVPPGS structures would be best built in a grouping of one or more dozens of structures. This would offer beneficial economies of scale in land acquisition, construction, replenishment, maintenance and output power transmission.

Figure 4:
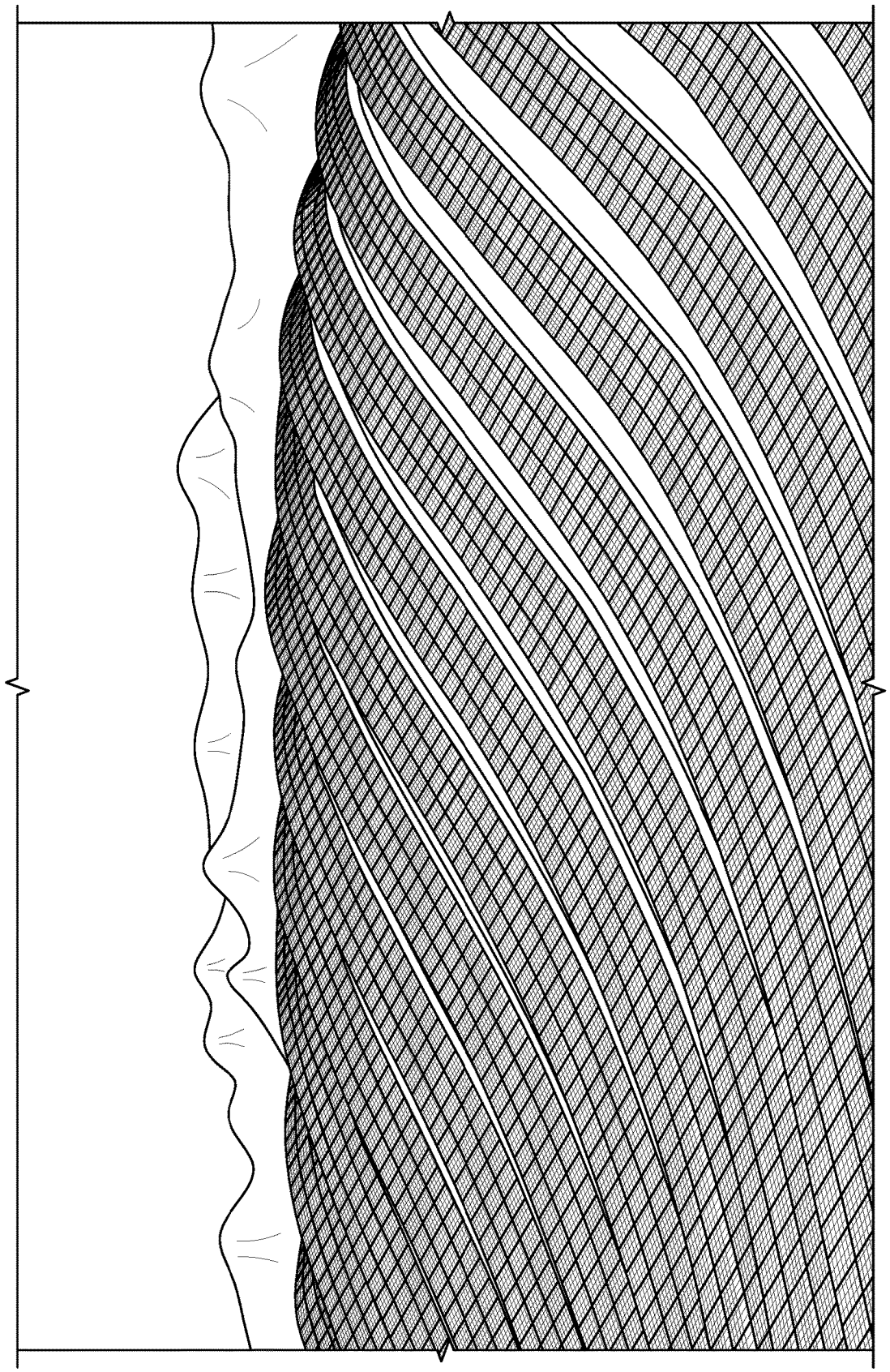
FIG. 4 is a Top, Landscape illustrated view of a plurality of exemplary downrange PV Outputs emanating from a plurality of unseen PVPPGS structures and how such would appear on the general landscape.
Figure 5A:
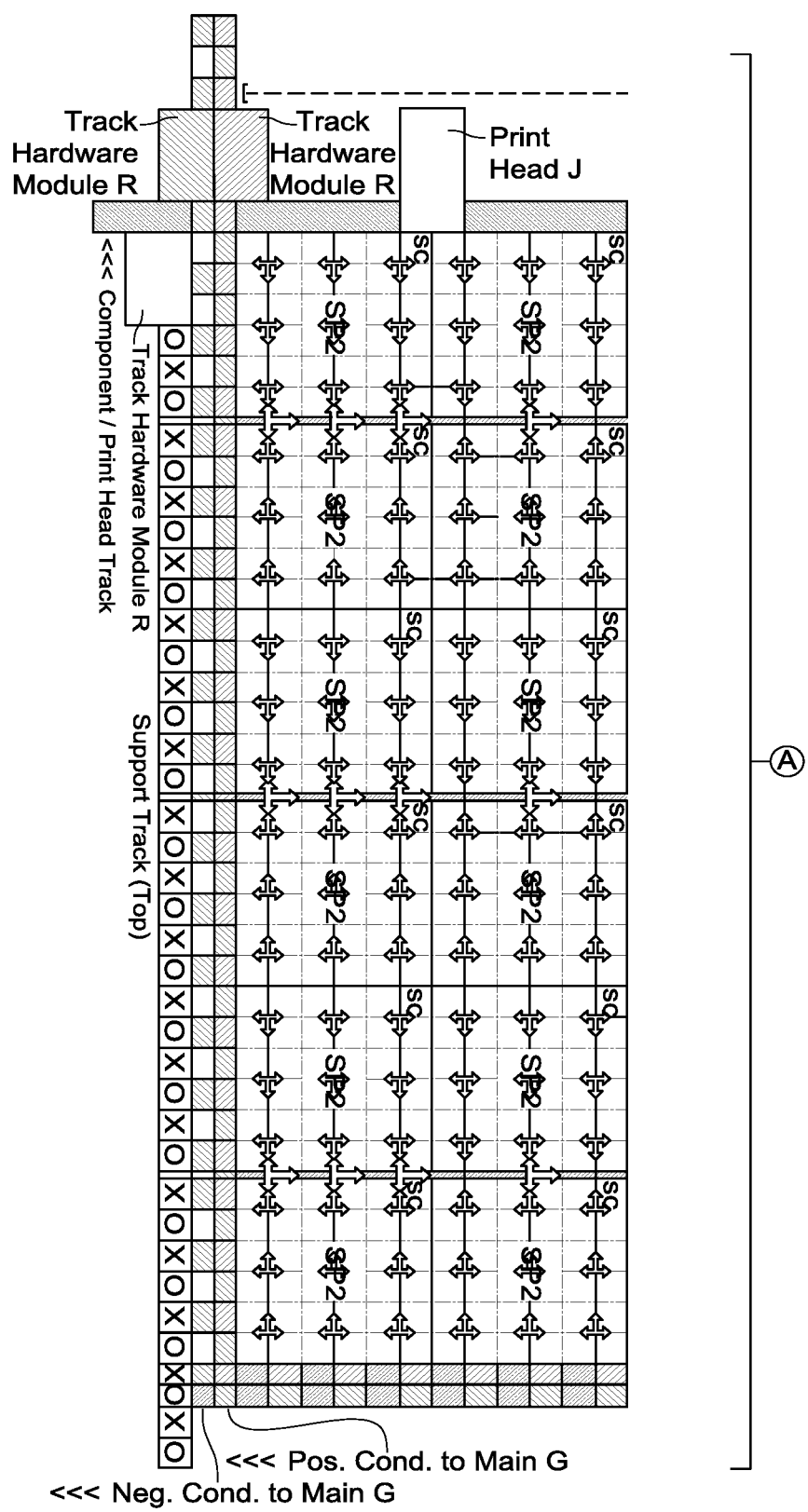
FIGS. 5A-5K together show an exemplary embodiment of the printed PV sheets shown schematically. These figures connect end-to-end vertically. Thirty-Six (36) small, discrete, individual solar cells make up a progressively larger SP2 subpanel. Thirty-Six (36) individual SP2 solar panels make up a progressively larger SP3 subpanel. Thirty-Six (36) individual SP3 solar panels make up a progressively larger SP4 subpanel. In some exemplary embodiments, each SP4 subpanel connects through a main positive and negative conductor to the main electrical grid.
Figure 5B:
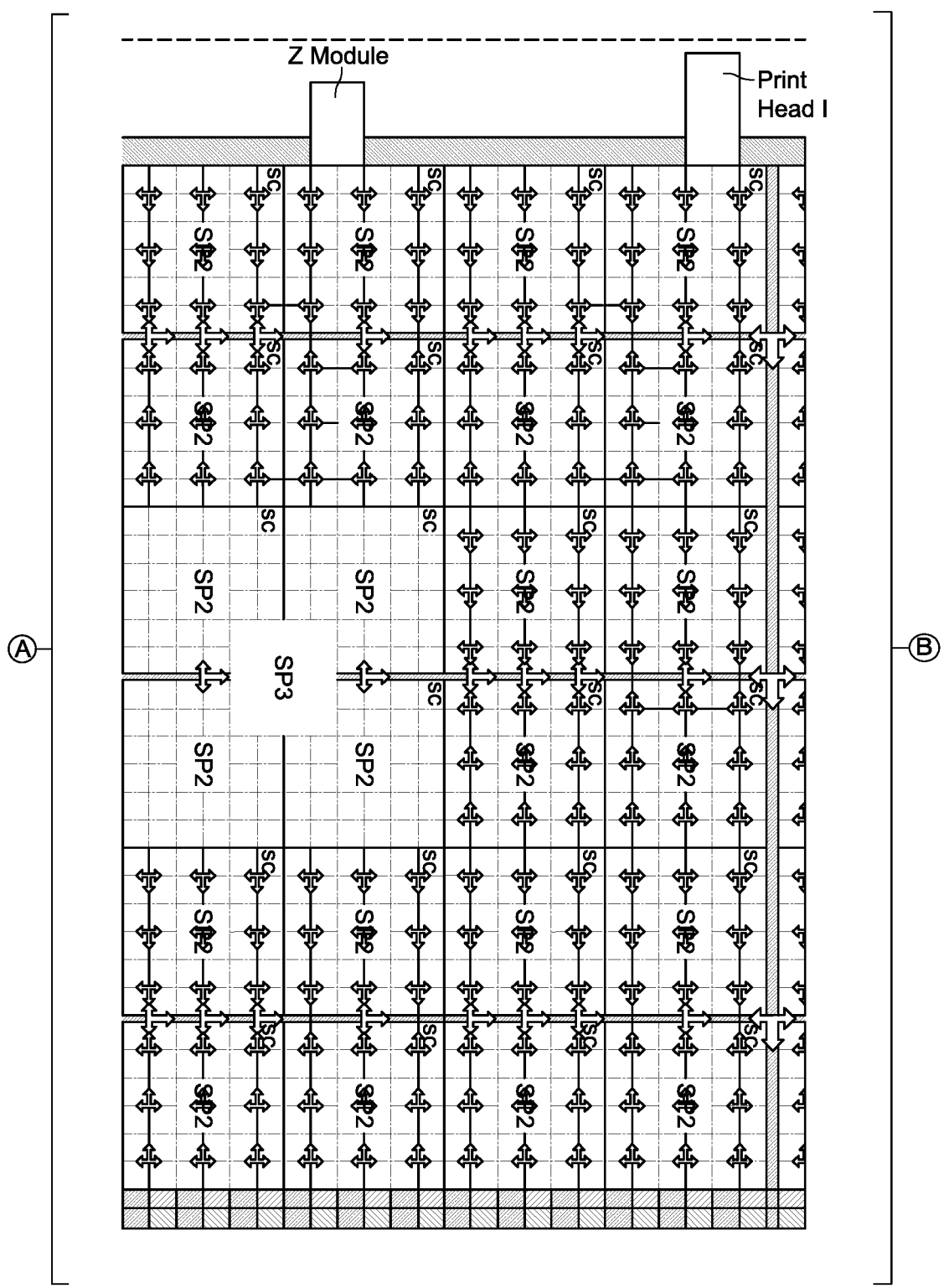
Figure 5C:
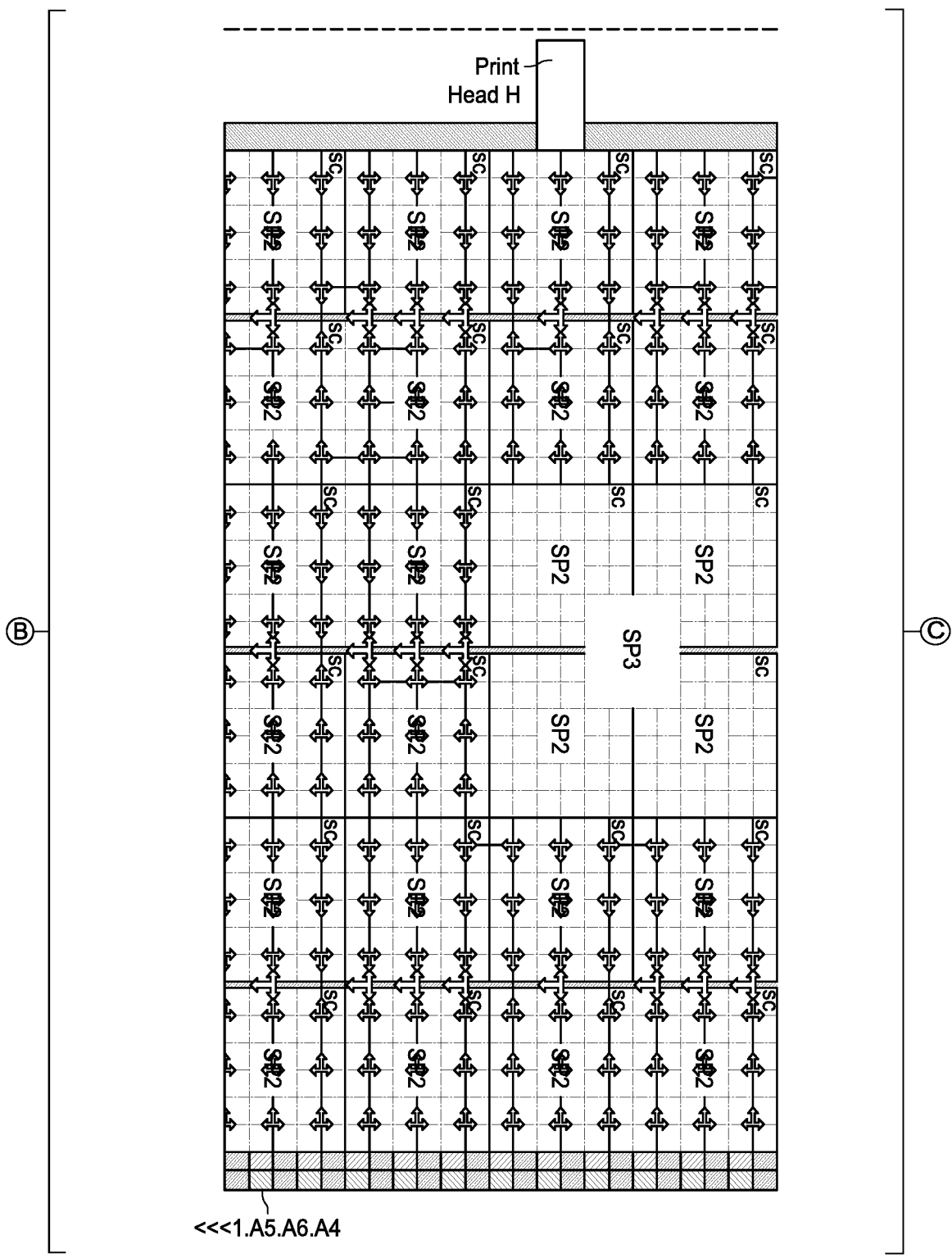
Figure 5D:
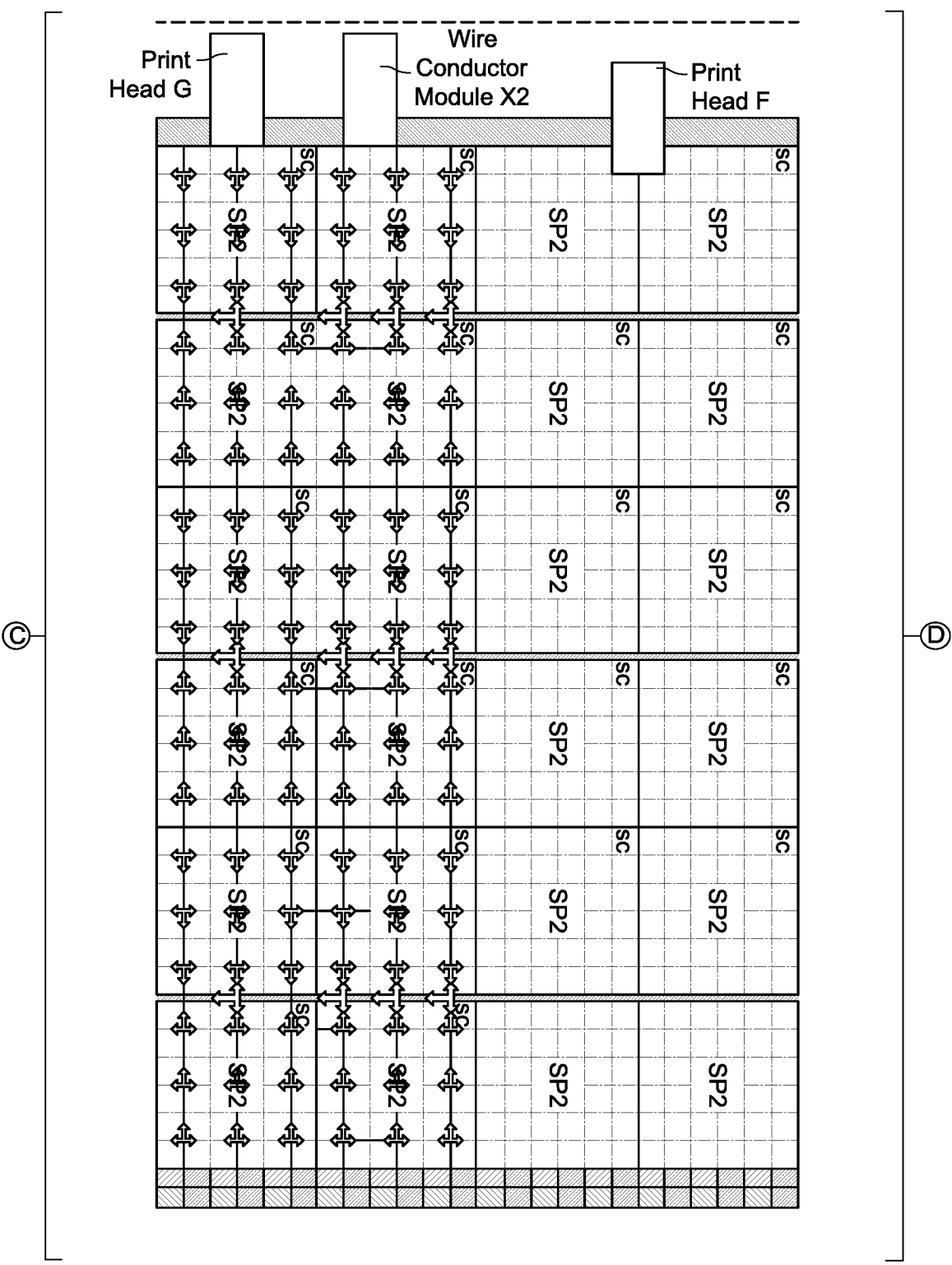
Figure 5E:
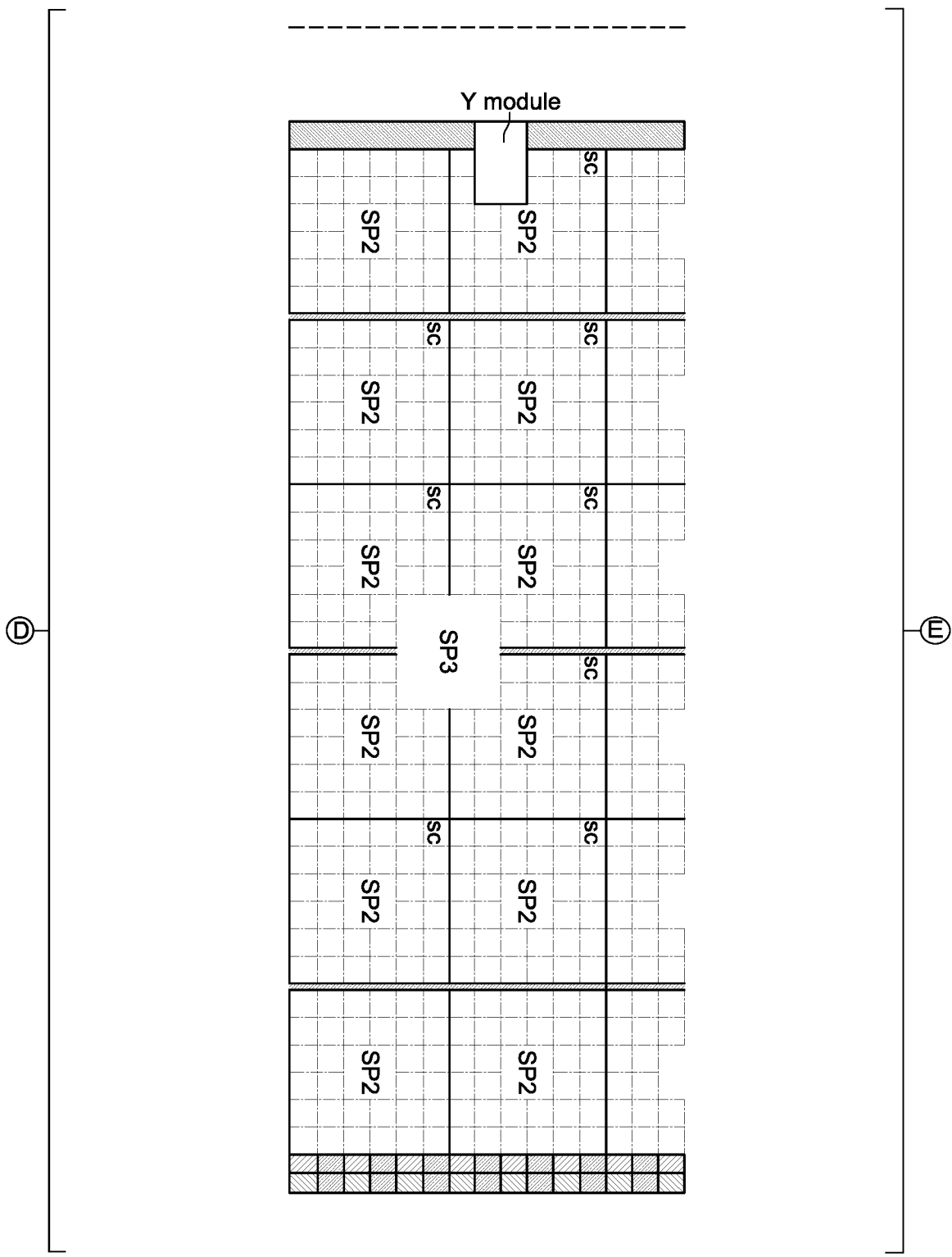
Figure 5F:
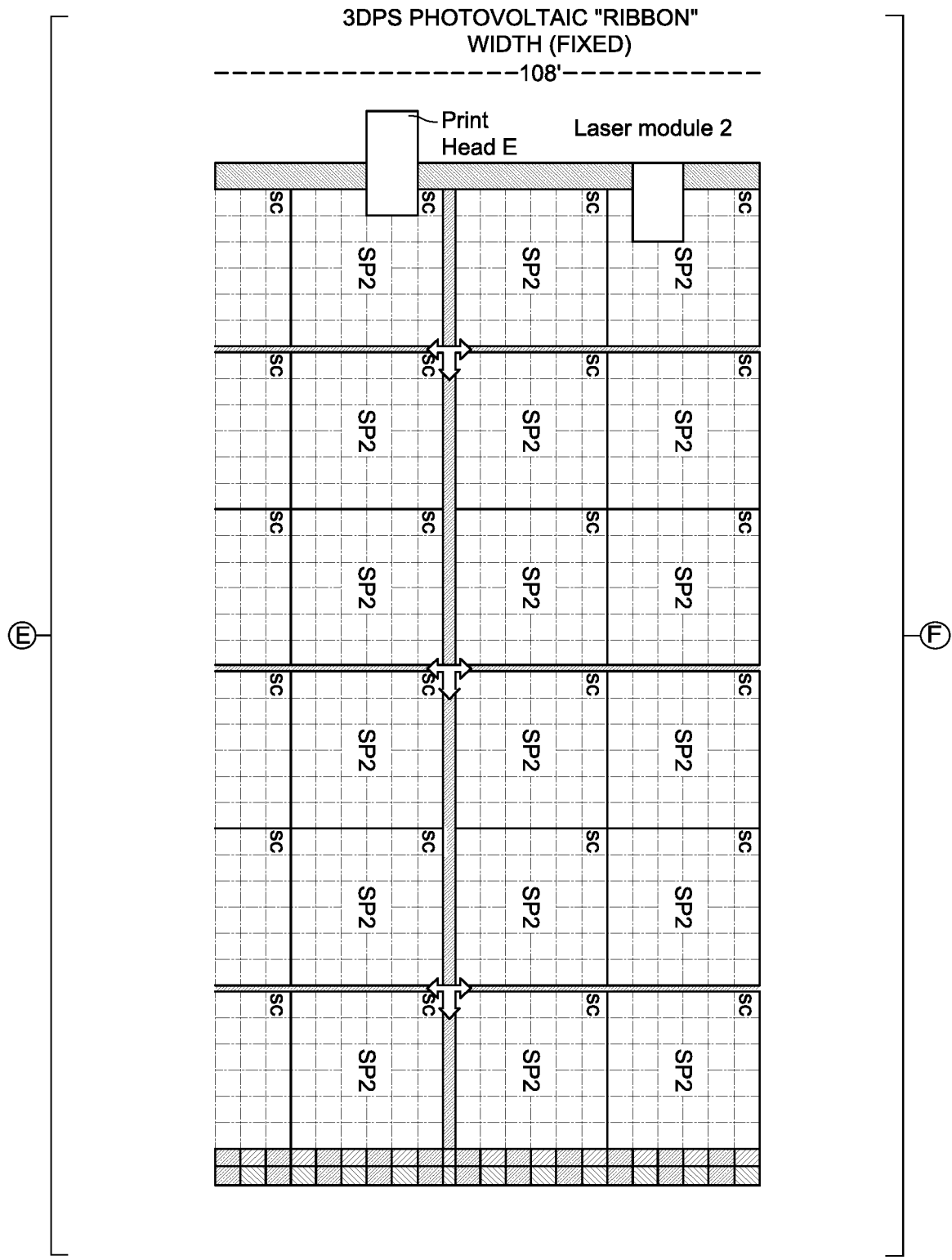
Figure 5G:
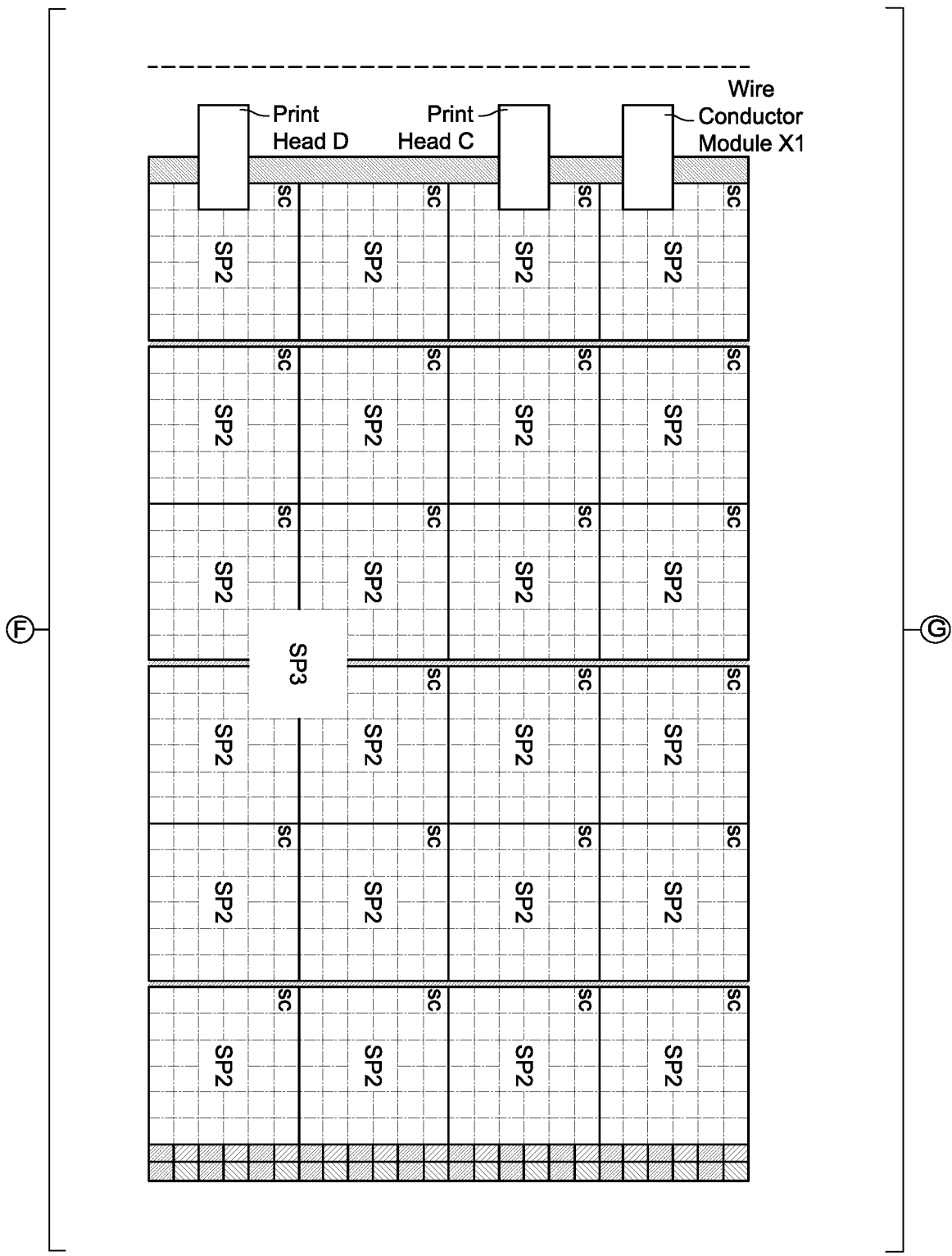
Figure 5H:
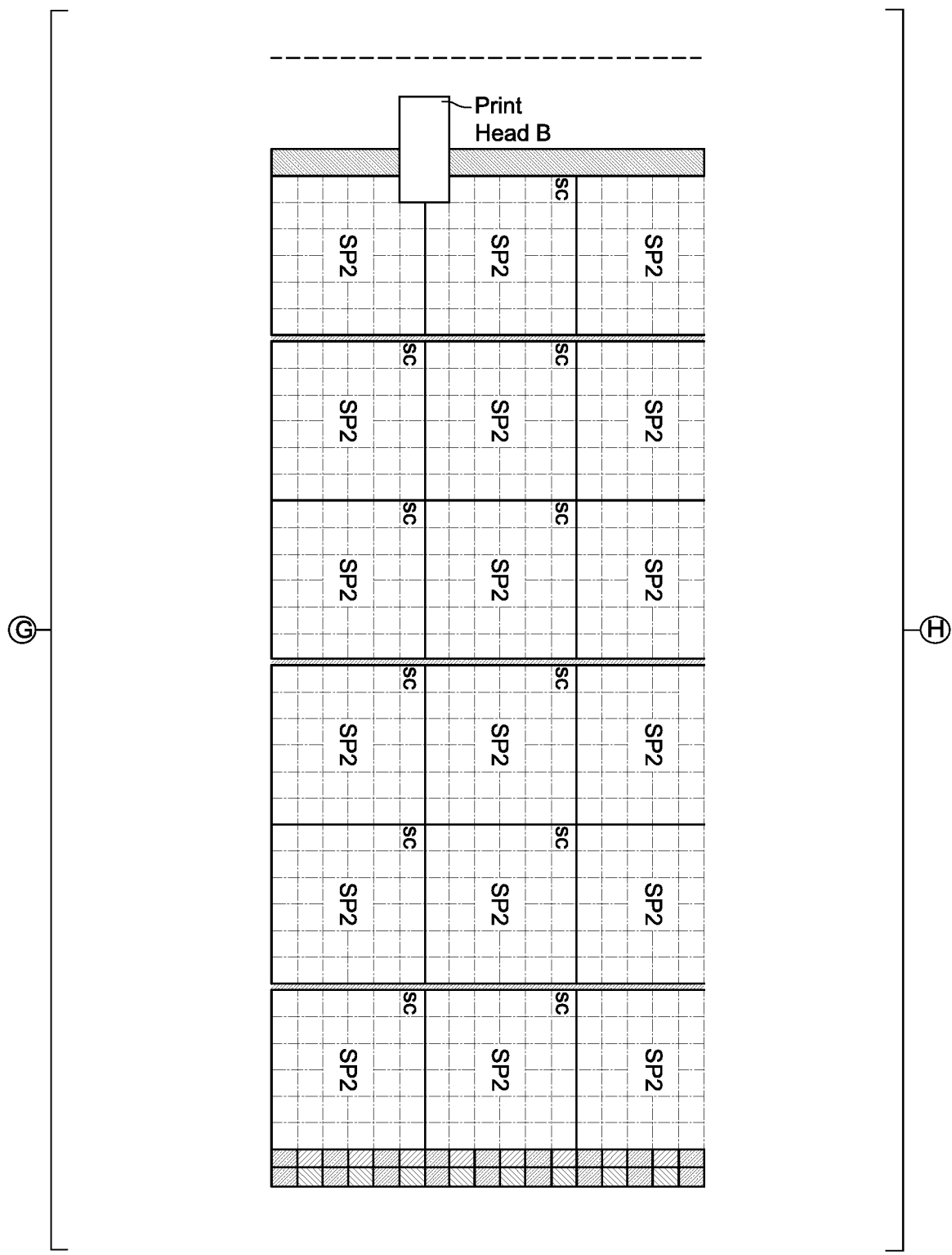
Figure 5I:
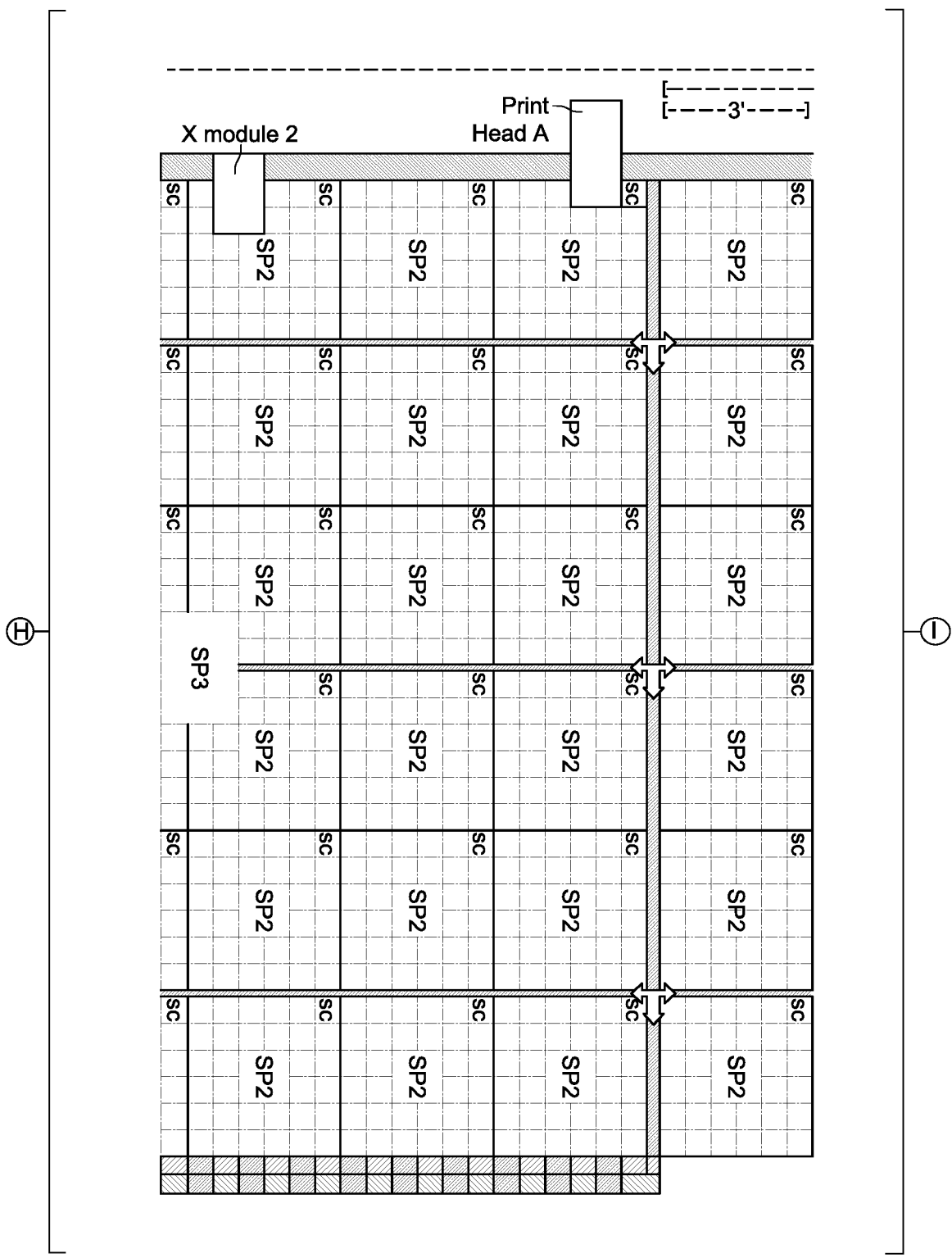
Figure 5J:
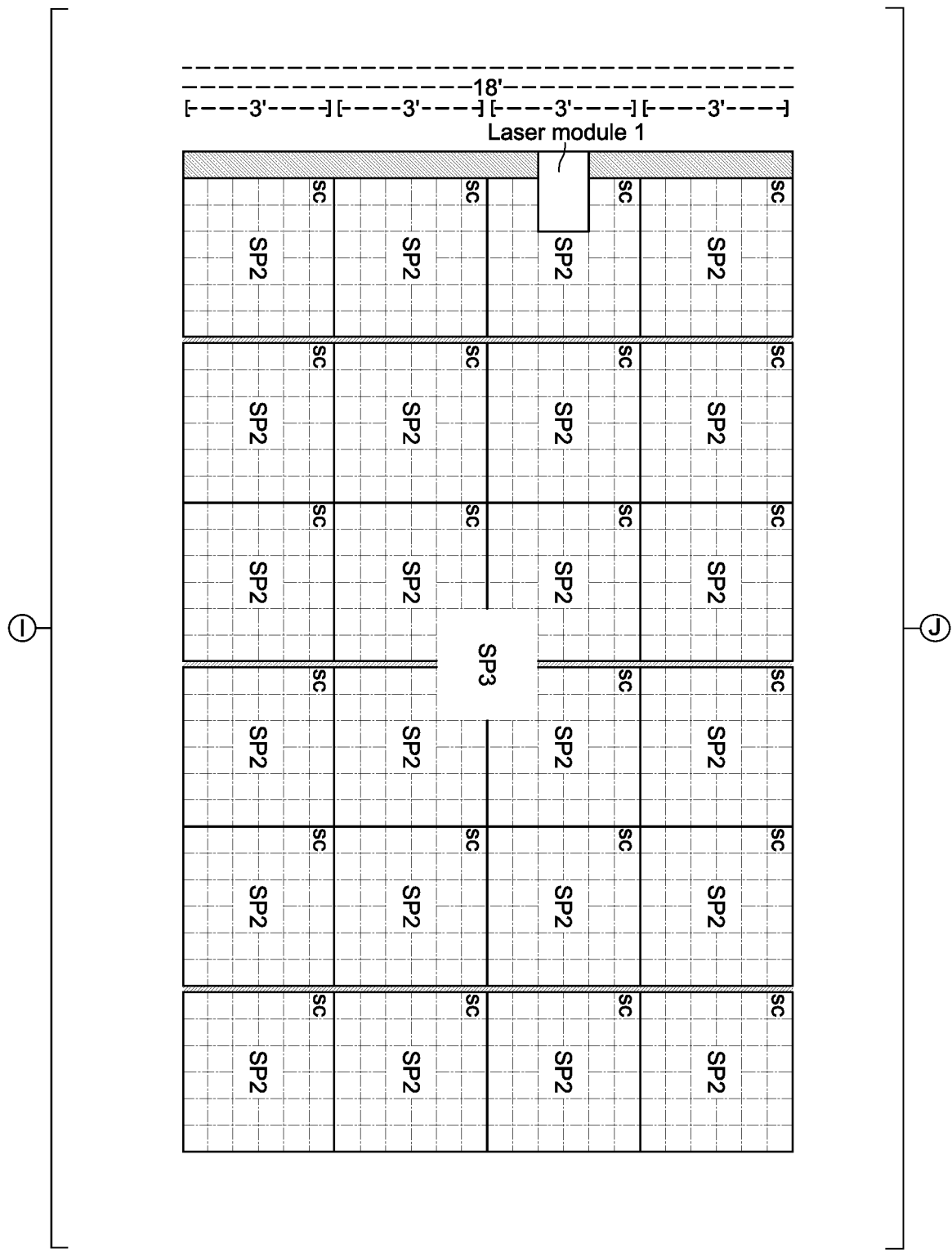
Figure 5K:
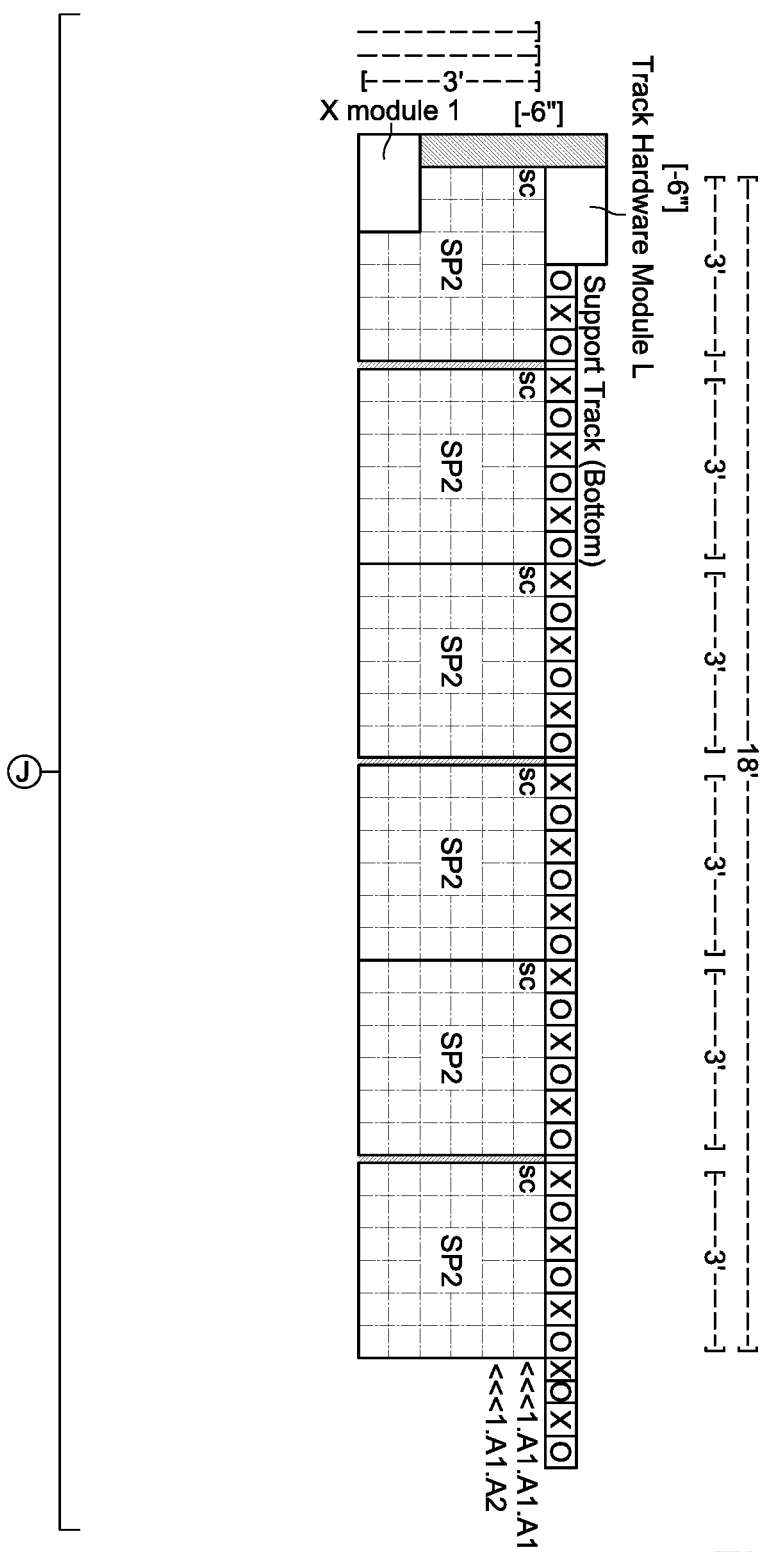

In FIG. 4, we see in this top-view, landscape illustration how a group of downrange PV Outputs from a number of PVPPGS structures would appear on the general landscape.

In exemplary embodiments such as is shown schematically in FIGS. 5A-5K, the printed PV sheets consist of small discrete, individual subpanels of the size deemed most efficient for the particular process or method so utilized at that time by design factors such as efficiency, manufacturing processes, material properties, cost, etc. (e.g. 6" sq.). As shown in these Illustrations, a number of these 3DPS manufactured PV-1 cells (e.g. 36) would be, firstly, interconnected in series through, most likely, integrated printed circuits thereby creating a PV-2 subpanel. In some exemplary embodiments, each of these PV-2 subpanels would be, secondly, interconnected in series through, most likely, conductive wire of appropriate gauge into PV-3 subpanels. This process would proceed until the width of the substrate material was fully processed (i.e. about 54 feet). In some exemplary embodiments, each of these PV-3 subpanels would be, thirdly, interconnected in series through, most likely, conductive wire of larger appropriate gauge into PV-4 subpanels. Certain subpanels are interconnected in series until optimal operational voltage is achieved. At this point, each PV-X+1Y subpanels are then interconnected in parallel to achieve maximum obtainable operational current. Integrated printed circuits would be utilized (and would be preferable) until the design limitation of such circuits was reached and then outboard wiring of increasing conductor wire gauge size would become necessary. In essence, the lateral width if the completed PV Output is the primary factor in achieving operational voltage whereas the longitudinal length of the completed PV Output is the primary factor in achieving maximum operational current output. Therefore, a PVPPGS system that has had time to produce two (2) miles of PV Output would have nominal current of approximately 2× a PVPPGS system that has had time to produce only one (1) mile of PV Output. Both PVPPGS systems, however, would operate at the same operational voltage, despite their respective length.

Figures 6A, 6B:
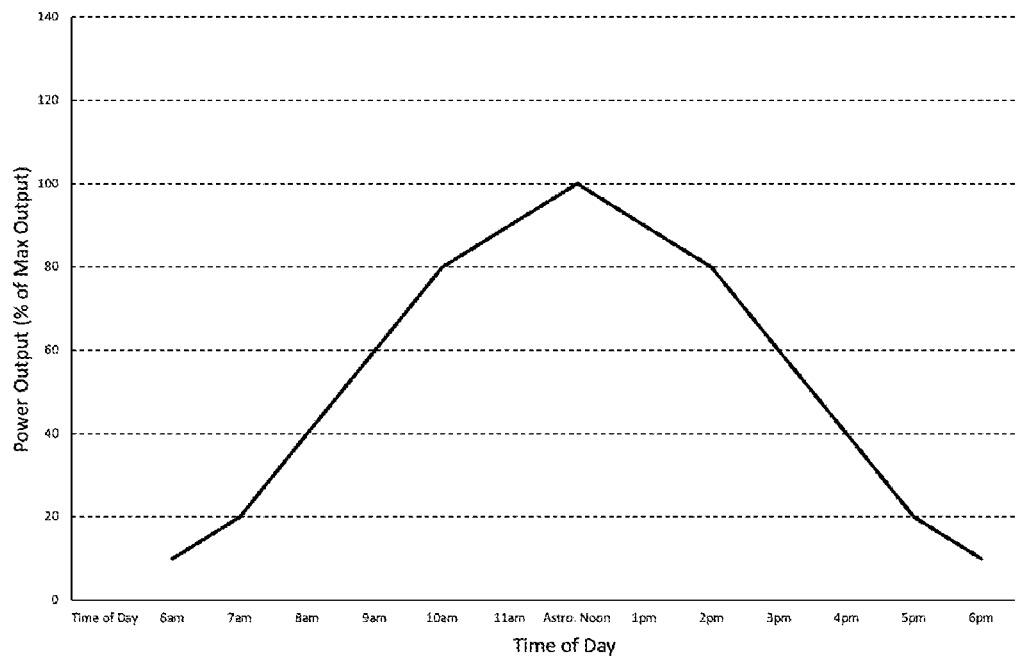
FIGS. 6A and 6B are a chart and graphical representation, respectively, of exemplary downrange power outputs of the Integrated Large-Scale Photovoltaic Printing and Power Generating Station ("PVPPGS") in the "Tent" Configuration by time of day.

The exemplary embodiments of the invention in Illustrations 1A, 1B and 1C all depict the PV Output in the downrange "Tent" Configuration. This low-angled, semi-horizontal embodiment would have maximum efficiency at astronomical noon or the time of day where the Sun is at its highest point. Exemplary Operational PV Current Output resulting from differing sunlight patterns at different times of the day of this particular "Tent" embodiment are depicted in FIGS. 6A and 6B.

In exemplary Tent Configuration embodiments, a low-cost, transparent, thin membrane may be suspended above the PV Output. When this layer becomes dirt ridden, clouded or otherwise damaged by UV rays it can be easily replaced in order to maintain optimal PV Output efficiency.

Figures 7A, 7B:
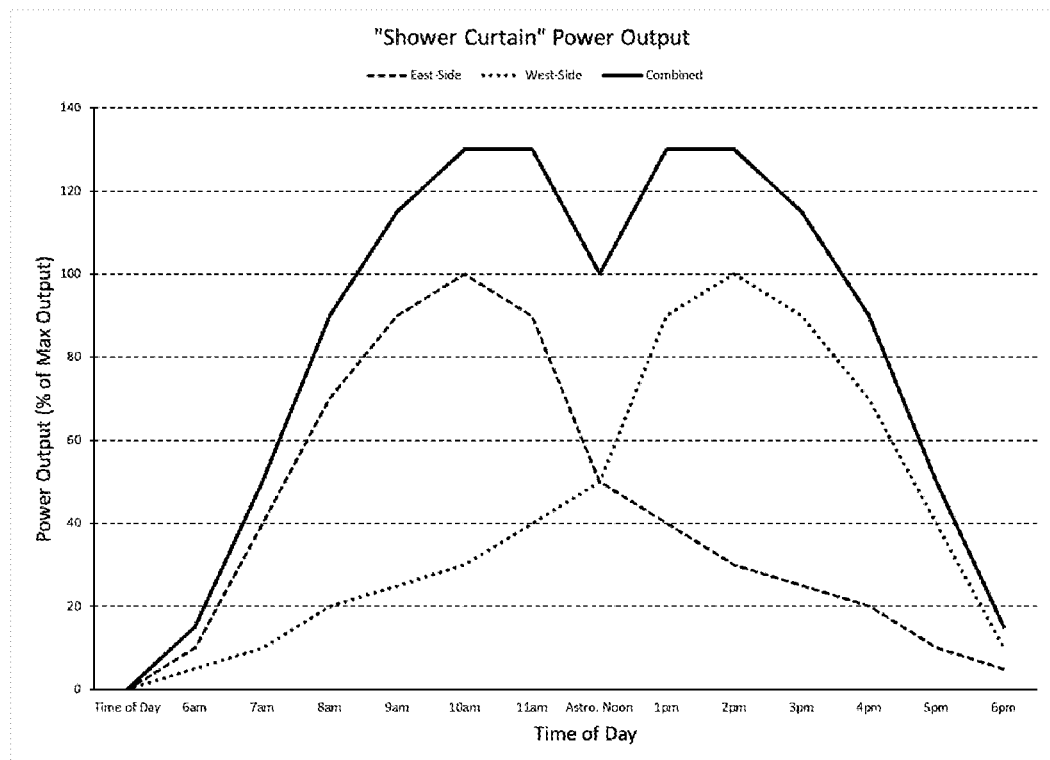
FIGS. 7A and 7B are a chart and graphical representation, respectively, of exemplary downrange power outputs of the Integrated Large-Scale Photovoltaic Printing and Power Generating Station ("PVPPGS") in the "Shower Curtain" Configuration by time of day.

In other exemplary embodiments (e.g., FIG. 2 of U.S. Pat. No. 9,748,431) the PV Output is suspended substantially vertically from an elevated DTS track system. This vertical embodiment has been called a "Shower Curtain" embodiment because the Thin-Film Solar Cells would hang vertically from an elevated track like a shower curtain. In this embodiment, the TFSC could be printed on both sides of the substrate material or, just like in the Tent Configuration, can be printed on two separate substrate ribbons but then joined together back to back when installed on the Vertical DTS System. In this embodiment, the lowest Operating Power Output would, surprisingly, occur at Astronomical Noon because the Sun would be directly overhead and shinning straight down upon the edge of the PV Output. In this design, the double-sided PV Output is exposed to direct sunlight on one side half the day and exposed to indirect sunlight on the alternate side for the same period. At astronomical noon, both sides would be in indirect sunlight—albeit bathed in intense indirect light. After astronomical noon, the alternate side would now be in direct sunlight while the other side is now in indirect sunlight. This vertical embodiment may be preferable in some circumstances over the Tent design because Operating Power Output would be relatively consistent throughout the entire day from just after sunrise to just before sunset. Therefore, contribution by the solar cells to the regional power grid would be more stable and of higher duration than the Tent Configuration. This vertical embodiment would also be far less affected by sand, dirt, droppings, etc. Exemplary Operational PV Current Output resulting from differing sunlight patterns at different times of the day of this particular "Shower Curtain" embodiment are depicted in FIGS. 7A and 7B.

In both horizontal and vertical exemplary embodiments, the PV printed fabric is outfitted with the necessary mounting hardware (depending on flat or shower curtain) after being printed and is then routed to the conveyor or support track for final mounting and routing.

In yet other exemplary embodiments, the substrate material may woven or otherwise manufactured at the site of the PVPPGS structure from carbon fiber yarn or other such material. This may ease any difficulties in transportation and handling of the large spools of substrate material and reduce costs thereof.

Figure 8:
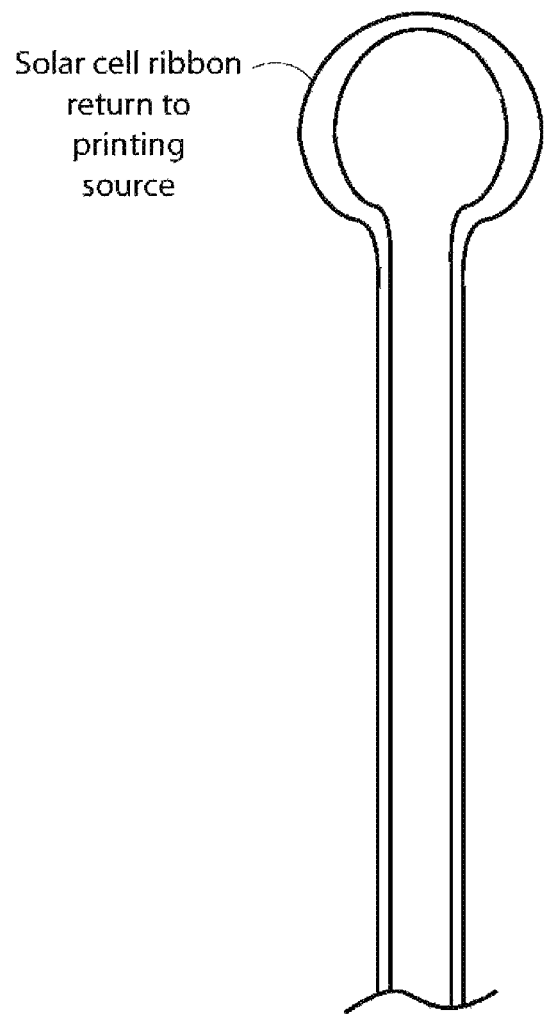
FIG. 8 is a top illustrated view of exemplary downrange half-life "turn-around" of the PV Output for refurbishment and/or recycling after the useful life of the solar panels has been reached.
Figure 9:
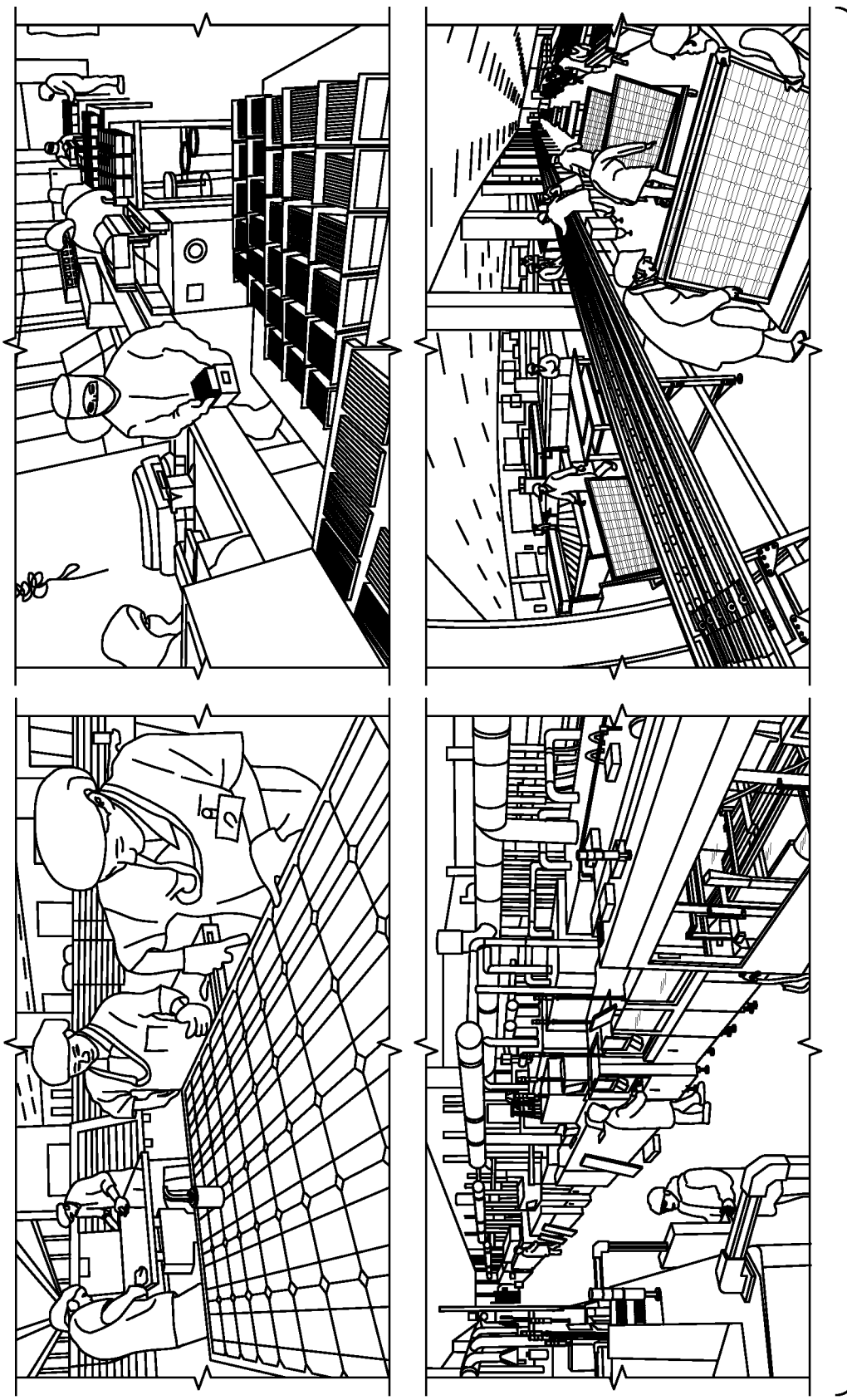
FIG. 9 shows exemplary illustrations of large factories, labor forces and complicated, expensive manufacturing processes that are required in conventional solar cell production standards.
Figure 10:
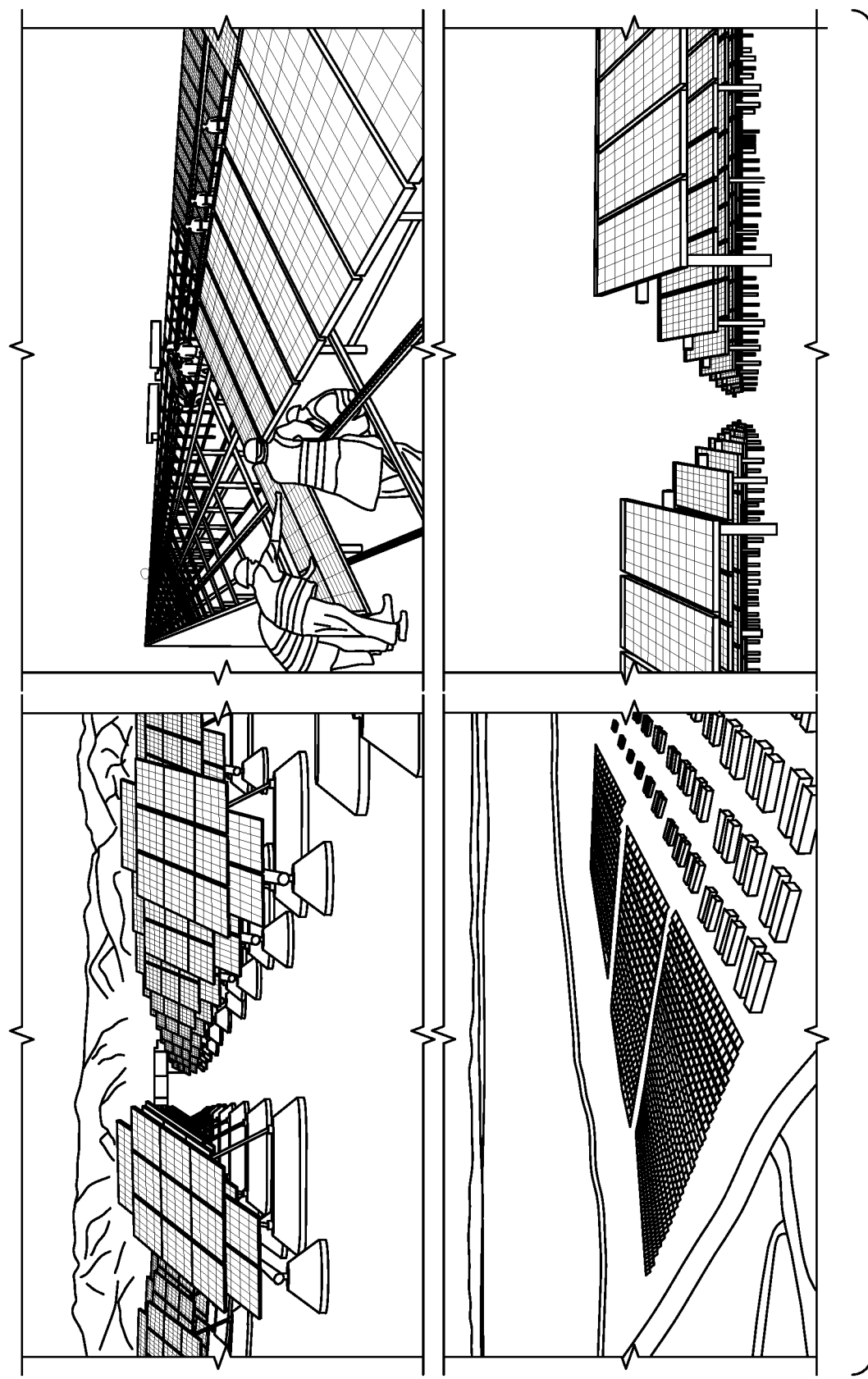
FIG. 10 shows exemplary illustrations of comparatively small-scale and expensive deployments of conventional solar panel technology standards in "fields" or "farms" with concrete stands and steel framework.

In yet other exemplary embodiments, the PV Output (either "Tent" or "Shower Curtain" configuration) could be rerouted back to the PVPPGS structure by routing the DTS structure in an "upside-down tear drop" shape (see FIG. 8). This rerouting would optimally occur exactly where the PV Output is then located downrange at the midway point (e.g. 10 years) of its operational useful life (e.g. 20 years). Once back in the vicinity of the primary PVPPGS operations, the spent PV Output which has exceeded its useful life and is no longer viable as a photovoltaic medium, could possibly be refurbished and/or recycled. As improvements in technology and methods occur that increase the operational useful life of the PV Output, the midlife turnaround point can be moved further downrange.

In all exemplary embodiments, automation of systems and processes is utilized to the greatest extent possible to minimize required labor inputs.

In exemplary embodiments, the following methodology used:
- Connect the printer and building housing the printer to the electrical grid;
- The printer, track system, and associated circuits and communications are powered by the electrical grid;
- Continuously print PV sheet (as long as printing conditions are met, e.g., all PV inks are available, grid power is available, and there is sufficient buffer room in the building or sufficient empty track to accept newly printed PV Output);
- Continuously or intermittently convey printed PV Output to its track (horizontal or vertical);
- Route power from sun-exposed PV sheet to power the printer, track system, and associated circuits and communications while it is being generated;
  - While printing, and while the PV sheet provides insufficient power (e.g., at night, or on cloudy days, or while the PV sheet is relatively small), use grid power to power the printer, track system, and associated circuits and communications;
  - While not printing, e.g., when printing conditions are not met, route power from sun-exposed PV sheet to the grid; and
  - While printing, and while the PV sheet provides sufficient power, use PV sheet-generated power to power the printer, track system, and associated circuits and communications and route excess power to the grid.

Exemplary embodiments of the invention herein result in a "ribbon" of continuous arrayed photovoltaic cells that extends many miles downrange on a track system (either substantially horizontally or vertically) that emanate from a large-scale, thin-film solar cell 3D printing structure, system and method with In-Situ high-output electrical power generation for supply to the main power grid.

The embodiments described herein are only exemplary and not intended to limit the scope or language of any future claims in any way which will have all of their full ordinary meanings. While the present invention has been illustrated by the description of embodiments thereof, and while the embodiments have been described in considerable detail, it is not the intention of the applicants to restrict or in any way limit the scope of the invention to such details. Additional advantages and modifications will readily appear to those skilled in the art. For example, the track need not be a simple out and back configuration; a single track can zig-zag back and forth away from the printer and optionally back to the printer. As another example, although organic ink printed PV substrates are discussed herein, the application is not limited to organic ink PV printers or PV printers in general or even PV printed substrates. Many benefits of the present application would be obtained by attaching traditional thin-film photovoltaic cells (e.g., multijunction PV cells (2-terminal, monolithic), single-junction GAAs PV cells, crystalline Si PV cells, thin-film technology PV cells, and/or printed PV cells) (with adhesive or fasteners or into transparent pocket in the substrate or other connection means) on a wide, flat and continuous substrate to form a wide, flat and continuous array of solar cells (also PV ribbons and PV sheets) using any of the related systems and methods herein (e.g., horizontal track, vertical track, power methods, powering the manufacturing site by the manufactured PV ribbon or PV sheet in sunlight, etc.). Traditional thin-film photovoltaic cells (e.g., multijunction PV cells (2-terminal, monolithic) can include, for example, lattice matched, metamorphic, inverted metamorphic, three junction (concentrator), three junction (non-concentrator), two junction (concentrator), two junction (non-concentrator), 4 or more junction (concentrator), or 4 or more junction (non-concentrator) PV cells. Single-junction GAAs PV cells can include, for example, single crystal, concentrator, or thin film crystal PV cells. Crystalline Si PV cells can include, for example, single crystal (concentrator), single crystal (non-concentrator), multicrystalline, thick Si film, silicon heterostructures (HIT), or thin-film crystal PV cells. Thin-film technology PV cells can include, for example, CIGS (concentrator), CIGS, CdTe, Amorphous Si:H (stabilized), nani-Si, micro-Si, poly-Si, or multi junction polycrystalline PV cells. And printed PV cells can include, for example, dye-sensitized cells, Perovskite cells, organic cells, organic tandem cells, inorganic cells (e.g., CZTSSe), quatum dot cells, or any of the other embodiments herein PV cells. In this broader context, the terms PV "ribbons" and PV sheets can mean any of these technologies and the term PV printer throughout can be thought of as a manufacturing site. As yet another example, the steps of all processes and methods herein can be performed in any order, unless two or more steps are expressly stated as being performed in a particular order, or certain steps inherently require a particular order. Therefore, the inventive concept, in its broader aspects, is not limited to the specific details, the representative apparatus, and illustrative examples shown and described. Accordingly, departures may be made from such details without departing from the spirit or scope of the applicant's general inventive concept.

What is claimed is:

1. A solar power generation station comprising:
   a solar array extending from a first end to a second end; and
   a plurality of interconnected solar cells extending from the first end to the second end of the solar array;
   wherein the solar array is a wide, flat, and continuous array of the interconnected solar cells; and
   wherein the solar array has a width of about 50 feet to about 200 feet and has a continuous length of about 500 feet to about 20 miles.

2. The solar power generation station of claim 1, further comprising:
   a PV printer arranged at the first end of the solar array,
   wherein the PV printer is configured to print PV material to create new rows of interconnected solar cells at the first end of the solar array; and
   an automated conveying system configured to convey the new rows of interconnected solar cells away from the PV printer and into a sun-lit area proximate the PV printer, wherein the new rows of interconnected solar cells are attached to and extend the length of the solar array.

3. The solar power generation station of claim 2, wherein the PV printer is configured to print the PV material to form new rows of interconnected solar cells using large-scale 3D printing technology.

4. The solar power generation station of claim 2, wherein the automated conveying system is configured to hang the solar array substantially vertically in the sun-lit area and is configured to permit the second end of the solar array to move away from the PV printer as the new rows of interconnected solar cells are printed by the PV printer at the first end of the solar array.

5. The solar power generation station of claim 4, wherein the automated conveying system is configured to turn about 180 degrees at a distal end to convey the second end of the solar array back to the PV printer while remaining exposed to the sun in the sun-lit area.

6. The solar power generation station of claim 2, wherein the automated conveying system is configured to support the solar array in a substantially horizontal orientation in the sun-lit area and is configured to permit the second end of the solar array to move away from the PV printer as the new rows of interconnected solar cells are printed by the PV printer at the first end of the solar array.

7. The solar power generation station of claim 6, wherein the automated conveying system is configured to turn about 180 degrees at a distal end to convey the second end of the solar array back to the PV printer while remaining exposed to the sun in the sun-lit area.

8. The solar power generation station of claim 2, further comprising power transmission cables configured to route power generated by the solar array to a power grid from a sun-exposed portion of the solar array arranged in the sun-lit area proximate the PV printer.

9. The solar power generation station of claim 2, wherein the PV printer is configured to be powered exclusively by power generated from the solar array.

10. The solar power generation station of claim 9, further comprising power transmission cables configured to route power generated by the solar array in excess of the power needed to power the PV printer is routed to a power grid from a sun-exposed portion of the solar array arranged in the sun-lit area proximate the PV printer.

11. A solar power generation station comprising:
a solar array extending from a stationary end to a moveable end;
a plurality of rows of interconnected solar cells extending from the stationary end to the moveable end of the solar array;
a means of extending the solar array configured to add a new row of solar cells to the plurality of rows of interconnected solar cells, wherein adding the new row of interconnected solar cells to the plurality of interconnected solar cells causes the movable end of the solar array to move away from the stationary end of the solar array; and
a means of conveying the plurality of rows of interconnected solar cells configured to convey the plurality of rows of interconnected solar cells away from the means of extending the solar array and into a sun-lit region proximate the means of extending the solar array;
wherein each row of the plurality of rows of interconnected solar cells has a width of about 50 feet to about 200 feet.

12. The solar power generation station of claim 11, wherein the means of extending the solar array is configured to consume less power from a main power grid as each new row of interconnected solar cells is added to the solar array.

13. The solar power generation station of claim 11, further comprising:
a first row of the plurality of rows of interconnected solar cells, wherein the first row is arranged at the moveable end of the solar array; and
an age gap between a first age of the first row of interconnected solar cells and second age of the new row of interconnected solar cells, wherein the age gap is at least 6 months.

14. The solar power generation station of claim 13, wherein a power output generated by the solar power generation station produces is greater than a power input needed to operate the means of extending the solar array when the age gap is not more than 6 months.

15. The solar power generation station of claim 13, wherein the means of conveying the solar array is configured to be turned about 180 degrees when the age gap is about 10 years.

16. The solar power generation station of claim 15, wherein the moveable end of the solar array is configured to return to the means of extending the solar array when the age gap is about 20 years.

17. The solar power generation station of claim 13, wherein the first row of interconnected solar cells is configured to be removed from the solar array when the age gap is about 20 years.

18. The solar power generation station of claim 11, wherein the means of conveying is configured to hang the solar array substantially vertically in the sun-lit area and is configured to permit the moveable end of the solar array to move away from the means of extending the solar array as the new row of interconnected solar cells is added to the stationary end of the solar array.

19. The solar power generation station of claim 11, wherein the means of conveying is configured to support the solar array in a substantially horizontal orientation in the sun-lit area and is configured to permit the moveable end of the solar array to move away from the means of extending the solar array as the new row of interconnected solar cells is added to the stationary end of the solar array.

20. The solar power generation station of claim 11, wherein the means of extending the solar array is configured to use large-scale 3D printing technology.

* * * * *